(12) United States Patent
Kim et al.

(10) Patent No.: US 8,339,728 B2
(45) Date of Patent: Dec. 25, 2012

(54) MAGNETIC MEMORY DEVICE USING MAGNETIC DOMAIN MOTION

(75) Inventors: Kee-won Kim, Yongin-si (KR); Tae-wan Kim, Yongin-si (KR); Young-jin Cho, Yongin-si (KR); In-jun Hwang, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1269 days.

(21) Appl. No.: 11/708,352

(22) Filed: Feb. 21, 2007

(65) Prior Publication Data
US 2007/0198618 A1 Aug. 23, 2007

(30) Foreign Application Priority Data
Feb. 23, 2006 (KR) .................. 10-2006-0017875

(51) Int. Cl.
*G11C 29/00* (2006.01)
(52) U.S. Cl. ............... 360/80; 360/51; 360/63; 360/85; 257/686
(58) Field of Classification Search ................. 365/80, 365/85, 51, 63; 257/686
See application file for complete search history.

(56) References Cited

U.S. PATENT DOCUMENTS

| | | | |
|---|---|---|---|
| 6,754,124 B2 | 6/2004 | Seyyedy et al. | |
| 6,879,508 B2 | 4/2005 | Tran | |
| 6,879,515 B2 | 4/2005 | Yoda et al. | |
| 6,885,573 B2 | 4/2005 | Sharma et al. | |
| 6,898,132 B2 * | 5/2005 | Parkin .................. | 365/189.12 |
| 6,909,129 B2 | 6/2005 | Kim et al. | |
| 7,291,878 B2 | 11/2007 | Stipe | |
| 7,315,470 B2 * | 1/2008 | Parkin ...................... | 365/173 |
| 2004/0251232 A1 | 12/2004 | Chen et al. | |
| 2004/0257719 A1 | 12/2004 | Ohba et al. | |
| 2006/0120132 A1 * | 6/2006 | Parkin ....................... | 365/80 |

(Continued)

FOREIGN PATENT DOCUMENTS
EP    1 320 102 A2    6/2003
(Continued)

OTHER PUBLICATIONS

European Search Report dated Jul. 2, 2007 for corresponding European Application No. 07102158.8.

(Continued)

*Primary Examiner* — Samuel Gebremariam
(74) *Attorney, Agent, or Firm* — Harness, Dickey & Pierce, P.L.C.

(57) ABSTRACT

Example embodiments may provide a magnetic memory device. The example embodiment magnetic memory devices may include a plurality of memory tracks, bit lines, connectors, a first input portion, and/or selectors. The memory track(s) may be stacked on a substrate to form a multi-stack. A plurality of magnetic domains may be formed in the memory track so that a data bit may be represented by a magnetic domain and may be stored in an array. The bit line(s) may be formed along respective memory tracks. The connector(s) may form a magnetic tunnel junction (MTJ) cell with one data bit region of the memory track. The first input portion may be electrically connected to each memory track and may input a magnetic domain motion signal to move data stored on a data bit region of the memory track to an adjoining data bit region. The selector(s) may select a memory track from a plurality of memory tracks on which a reading and/or writing operation may to be performed.

18 Claims, 7 Drawing Sheets

U.S. PATENT DOCUMENTS

2006/0258089 A1    11/2006    Chung-Zen
2007/0198618 A1    8/2007    Kim et al.

FOREIGN PATENT DOCUMENTS

| | | |
|---|---|---|
| JP | 2001-217398 | 8/2001 |
| JP | 2003-346489 | 12/2003 |
| JP | 2004-023062 | 1/2004 |
| JP | 2005-285475 | 9/2005 |
| JP | 2005-310829 | 11/2005 |
| KR | 10-2004-0086690 | 10/2004 |

OTHER PUBLICATIONS

Chinese Office Acton dated Apr. 13, 2010 with English translation for corresponding Chinese Application No. 200710084975.7.
Office Action dated Nov. 14, 2007 in corresponding Korean Patent Application No. 10-2006-0126408.
U.S. Office Action dated Nov. 30, 2011, issued in co-pending U.S. Appl. No. 11/978,583.
Japanese Office Action dated Mar. 13, 2012 issued in Japanese Application No. 2007-033805.

\* cited by examiner

MAGNETIC MEMORY DEVICE USING MAGNETIC DOMAIN MOTION

PRIORITY STATEMENT

This application claims the benefit of Korean Patent Application No. 10-2006-0017875, filed on Feb. 23, 2006, in the Korean Intellectual Property Office, the disclosure of which is incorporated herein in its entirety by reference.

BACKGROUND

1. Field

Example embodiments may relate to a magnetic memory, for example, to a magnetic memory where data bits represented by magnetic domains may be stored in an array using magnetic domain motion.

2. Description of the Related Art

Magnetic random access memories (MRAM) are a type of non-volatile magnetic memory. MRAM is a solid state magnetic memory that uses magnetic resistance due to a spin-dependent conduction characteristic of a nano magnetic material. MRAMs may use giant magnetoresistance (GMR) and/or tunnel magnetoresistance (TMR) because spin, which is a degree of freedom of an electron, may have a significant influence on electron delivery.

GMR is a resistance difference that may be generated by a non-magnetic material between ferromagnetic materials having a same or different magnetization direction as an adjoining arrangement of ferromagnetic material/metallic non-magnetic material/ferromagnetic material. TMR is resistance where a current may more easily flow when two ferromagnetic materials have a same magnetization direction in an adjoining arrangement of ferromagnetic material/insulator/ferromagnetic materials than if the two ferromagnetic materials have different magnetization directions. Because MRAMs using GMR have a relatively smaller resistance difference caused by magnetization direction, a larger voltage difference may not be possible to achieve. Because MRAMs may have a larger cell formed by a metal oxide semiconductor field effect transistor (MOSFET) and GMR layer, it may be desirable to pursue MRAMs using a TMR layer.

An MRAM may include a transistor, which may be a switching device, and/or a magnetic tunnel junction (MTJ) cell in which data may be stored. The MTJ cell may include a pinned ferromagnetic layer with a pinned magnetization direction, a free ferromagnetic layer with a magnetization direction parallel or anti-parallel to the pinned ferromagnetic layer's magnetization direction, and/or a non-magnetic layer between the pinned ferromagnetic layer and the free ferromagnetic layer to magnetically separate ferromagnetic layers.

Because a related-art MRAM may store only one bit of data per MTJ cell, there may be limitations in data storage capacity of MRAMs. A different type of storage technology may be required to increase information storage capacity of magnetic memories such as MRAMs.

SUMMARY

Example embodiments may provide a magnetic memory device. The example embodiment magnetic memory devices may include a plurality of memory tracks, bit lines, connectors, a first input portion, and/or selectors. The memory track(s) may be stacked on a substrate to form a multi-stack. A plurality of magnetic domains may be formed in the memory track so that a data bit may be represented by a magnetic domain and may be stored in an array. The bit line(s) may be formed along respective memory tracks. The connector(s) may form a magnetic tunnel junction (MTJ) cell with one data bit region of the memory track. The first input portion may be electrically connected to each memory track and may input a magnetic domain motion signal to move data stored on a data bit region of the memory track to an adjoining data bit region. The selector(s) may select a memory track from a plurality of memory tracks on which a reading and/or writing operation may to be performed.

Example embodiments may provide a magnetic memory device with a plurality of memory tracks each with a plurality of magnetic domains so that data bits may be stored in an array of magnetic domains. Each magnetic domain may use magnetic domain motion. Memory tracks may be formed in a multi-stacked structure, and data storage capacity may be increased.

Example embodiments may provide a magnetic memory device including a plurality of memory tracks stacked on a substrate forming a plurality of magnetic domains so that data bits may be stored in an array of magnetic domains, bit lines near the plurality of memory tracks, a connector between each memory track and bit line, which may create a magnetic tunnel junction (MTJ) cell with one data bit region of each memory track, a first input portion electrically connected to each memory track that may input a magnetic domain motion signal to move data to an adjoining data bit region, and/or a selector that selects a memory track on which a reading or writing operation may be performed.

The connector may include a reference layer corresponding to a portion of the memory track and having a pinned magnetization direction, wherein a data bit region corresponding to an effective size of the reference layer may be stored in an array on the memory track.

The connector may include a non-magnetic layer between the reference layer and the memory track.

The non-magnetic layer may be a conduction layer or an insulation layer that may act as a tunneling barrier.

The selector may include a plurality of impurity regions each connected to data bit regions forming MTJ cells of the memory tracks and/or a gate between two impurity regions. The selector may have a structure of a sharing transistor, wherein at least one impurity region may serve as a drain for a memory track and a source for another memory track and each impurity region may be connected to the data bit region constituting the MTJ of each memory track via a conductive plug.

Each memory track may include a data storage region having data bit regions corresponding to and storing the data bits and a buffer region that may adjoin the data storage region that may store, if necessary, data moved outside of the data storage region during a magnetic domain motion.

Each memory track may include a plurality of data storage regions. The buffer region may be between two adjoining data storage regions, and the connector and selectors may correspond to the plurality of data storage regions on each memory track.

The example embodiment memory device may include a second input portion that inputs one or more of a writing current signal and/or a reading current signal to the MTJ cell through the bit line.

BRIEF DESCRIPTION OF THE DRAWINGS

The above and other features and/or advantages of example embodiments will become more apparent by describing in detail the attached drawings in which.

DETAILED DESCRIPTION

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 1:
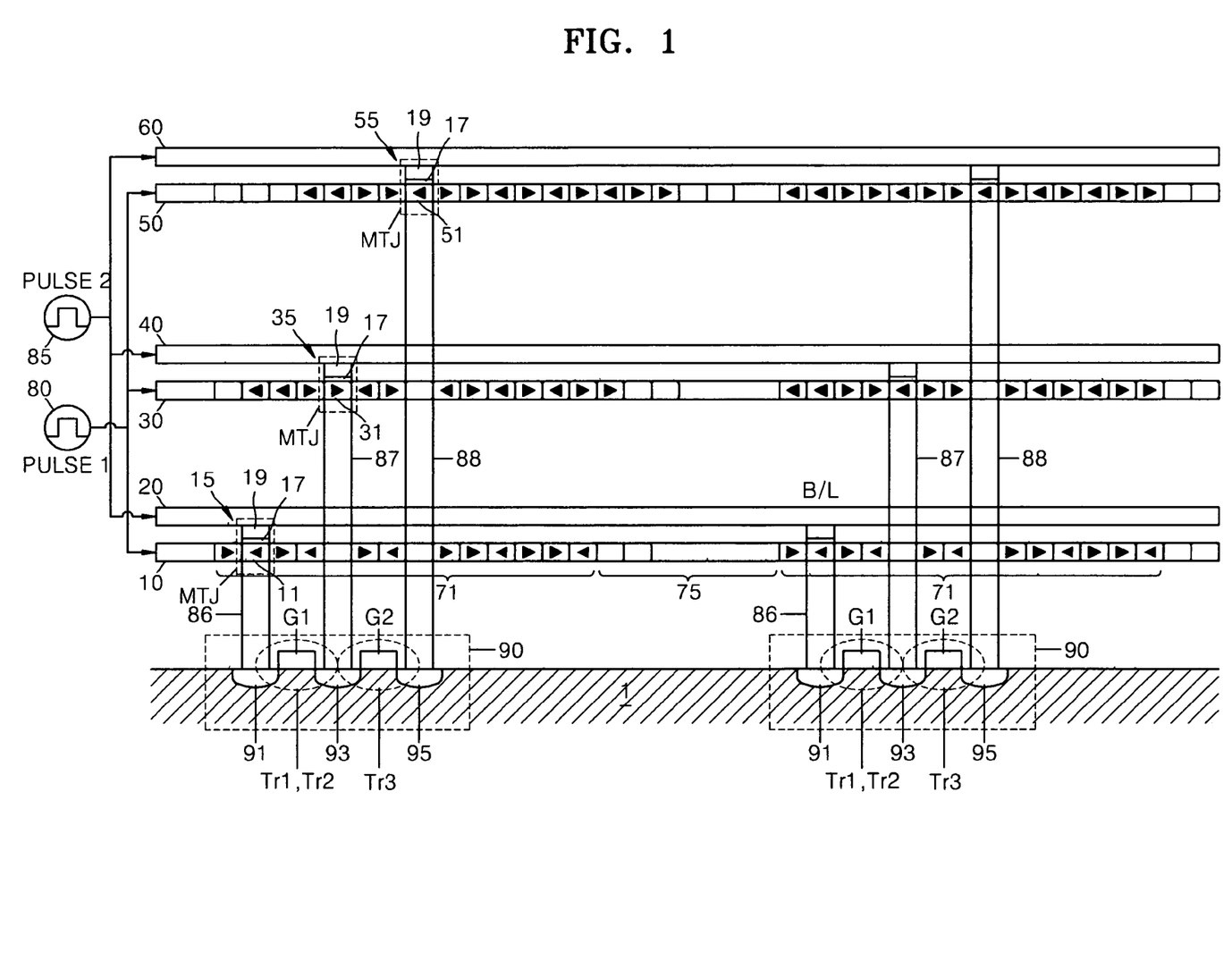
FIG. 1 is a schematic view illustrating the structure of an example embodiment magnetic memory device having multi-stacked memory tracks.

FIG. 1 is a schematic view illustrating the structure of an example embodiment magnetic memory device having multi-stacked memory tracks. As shown in FIG. 1, a Pulse 1 may be a magnetic domain motion signal, and a Pulse 2 may be a reading signal or a writing signal.

As shown in FIG. 1, an example embodiment magnetic memory device may include first, second, and third memory tracks 10, 30, and 50 stacked on a substrate and/or may include first, second, and third bit lines 20, 40, and 60 formed, respectively, along the first, second, and third memory tracks 10, 30, and 50. An example embodiment magnetic memory device may include first, second, and third connecting parts 15, 35, and 55 respectively, between each of the first, second, and third memory tracks 10, 30, and 50 and bit lines 20, 40, and 60 and/or may include a first input portion 80 electrically connected to the first, second, and third memory tracks 10, 30, and 50 that inputs a magnetic domain motion signal. The example embodiment magnetic memory device may include a selector 90 that may select a memory track from the first, second, and third memory tracks 10, 30, and 50 on which a reading or writing operation may be performed.

In the example embodiment magnetic memory device as illustrated in FIG. 1, the selector 90 may be formed in the substrate 1. The first memory track 10, the first bit line 20, the second memory track 30, the second bit line 40, the third memory track 50, and/or the third bit line 60 may be stacked on the selector 90 to form a layered structure. Insulation layers may be stacked between each layer of the structure. Empty spaces between elements in FIG. 1 may act as or be filled with insulation layers. The layered structure may be manufactured in any method known in the art.

The first, second, and third memory tracks 10, 30, and 50 may serve as recording layers and may have a switchable in-plane magnetization direction or a vertical magnetization direction. Each of the memory tracks 10, 30, and 50 may have a plurality of magnetic domains, so that a data bit of one magnetic domain may be stored in an array of data bits. Each of the memory tracks 10, 30, and 50 may have a plurality of magnetic domain walls on which a plurality of magnetic domains may be formed.

The first, second, and third connectors 15, 35, and 55 may be respectively between first, second, and third memory tracks and bit lines to form magnetic tunnel junction (MTJ) cells with data bit regions 11, 31, and 51. One end of each of the first, second, and third connectors 15, 35, and 55 may contact the first, second, and third bit lines 20, 40, and 60, respectively. The other end of each connector 15, 35, and 55 may respectively contact portions of the first, second, and third memory stacks 10, 30, and 50. The portions may be, for example, data bit regions 11, 31, and 51 that constitute the MTJ cells.

To form the MTJ cells, each of the first, second, and third connectors 15, 35, and 55 may have a reference layer 19 that corresponds to a portion of each of the first, second, and third memory tracks 10, 30, and 50 and that has a pinned magnetization direction. The reference layer 19 may have a pinned in-plane magnetization direction or a pinned perpendicular magnetization direction. Each of the first, second, and third connectors 15, 35, and 55 may include a non-magnetic layer 17 between the reference layer 19 and each memory track 10, 30, and 50. This non-magnetic layer 17 may be a conduction layer formed of a conductive material, for example, Copper (Cu), or an insulation layer formed of an insulating material, for example, aluminum oxide (AlOx), serving as a tunneling barrier.

Each of the first, second, and third memory tracks 10, 30, and 50 may have a switchable magnetization direction, while the reference layer 19 may have a pinned magnetization direction. The reference layer 19 may be formed having a multi-layered thin film structure made of antiferromagnetic materials, for example, IrMn, PtMn, and/or the like. If each of the memory tracks 10, 30, and 50 and the reference layer 19 are formed of the same material, the memory tracks may have relatively small coercive forces, and the reference layer 19 may have relatively large coercive forces. The coercive force may be controlled by changing a composition ratio of elements of materials used for the memory tracks 10, 30, and 50 and the reference layer 19.

Each data bit region formed by a magnetic domain in each of the memory tracks 10, 30, and 50 may represent 1 bit of data. Each data bit region may be a size corresponding to an effective size of the reference layer 19 of each connector 15, 35, and 55. The data bit may be stored in an array on the first, second, and/or third memory tracks 10, 30, and 50. The data bit region representing 1-bit of data may include a single magnetic domain.

In the example embodiment magnetic memory device in FIG. 1, a data writing operation and/or a stored data reading operation may be performed in an area unit of each of the first, second, and third memory tracks 10, 30, and 50 corresponding to an effective size of the reference layer 19. The effective area of the reference layer 19 may determine a size of one data bit region of each of the memory tracks 10, 30, and 50.

If only a single magnetic domain is to exist within one data bit region, magnetic domains in each of the memory tracks 10, 30, and 50 may have a size that corresponds to an effective size of the reference layer 19.

Each of the first, second, and third memory tracks 10, 30, and 50 may have a length equal to a multiple of a number of data bit regions or a width of a magnetic domain motion direction. An array of data bit regions of a single magnetic domain may be formed so that a plurality of data bits may be stored in an array on each of the memory tracks 10, 30, and 50.

As shown in FIG. 1, each of the memory tracks 10, 30, and 50 may include a data storage region 71 having a number of data bit regions corresponding to a number of data bits to be stored and/or a buffer region 75 adjacent to the data storage region 71 to store data moved outside of the data storage region 71 during a magnetic domain motion. The buffer region 75 may be located on one or more sides of the data storage region 71. Each of the memory tracks 10, 30, and 50 may not necessarily be divided into data storage regions and buffer regions.

In the example embodiment magnetic memory device of FIG. 1, each of the first, second, and third memory tracks 10, 30, and 50 may include a plurality of data storage regions 71. A buffer region 75 may be between consecutive data storage regions 71. The first, second, and third connectors 15, 35, and 55 and the selector 90 may each correspond to the plurality of data storage regions 71 in the first, second, and third memory tracks 10, 30, and 50.

The selector 90 may select a memory track from the memory tracks 10, 30, and 50 on which a reading or writing operation may be performed. The selector 90 may include first, second, and/or third impurity regions 91, 93, and 95, each of which may be connected to the data bit regions 11, 31, and 51 to form MTJ cells of the memory tracks 10, 30, and 50 and may include a first gate G1 and/or a second gate G2 that may act as word lines between the first and second impurity regions 91 and 93 and/or between the second and third impurity regions 93 and 95. The selector 90 be structures similar to a shared transistor such that one or more of the impurity regions may serve as a drain for a memory track and the other one of the impurity regions may serve as a source for another memory track.

For example, the first impurity region 91, the first gate G1, and the second impurity region 93 may serve as transistors Tr1 and Tr2 for the first and second memory tracks 10 and 30. For example, the second impurity region 93, the second gate G2, and the third impurity region 95 may serve as a transistor Tr3 for the third memory track 50. The first impurity region 91 may serve as a source, and the second impurity region 93 may serve as a drain for the first memory track 10. The first impurity region 91 may serve as a drain and the second impurity region 93 may serve as a source for the second memory track 30. The second impurity region 93 may serve as a drain and the third impurity region 95 may serve as a source for the third memory track 50.

For example, the first impurity region 91, the first gate G1, and the second impurity region 93 may also serve as a transistor Tr1 for the first memory track 10. The second impurity region 93, the second gate G2, and the third impurity region 95 may alternately serve as transistors Tr2 and Tr3 for the second and third memory tracks 30 and 50.

The substrate 1 may be a semiconductor substrate. The first and second gates G1 and G2 each having a gate insulation layer and/or a gate electrode may be formed on the substrate 1, and a region between the first and second gates G1 and G2, and regions of the substrate 1 between the first and second gates G1 and G2 may be doped with impurities to form the first, second, and third impurity regions 91, 93, and 95 that may serve as sources and drains. The selector 90 having a shared transistor structure may be formed on the substrate, and a stacked structure of the first memory track 10, the first connector 15, the first bit line 20, the second memory track 30, the second connector 35, the second bit line 40, the third memory track 50, the third connector 55, and the third bit line 60 may be formed. The memory tracks 10, 30, and 50, the connectors 15, 35, and 55, and the bit lines 20, 40, and 60 may be surrounded by insulation materials, except for connecting and conducting portions with other elements. Insulation layers may be formed between layers.

The first, second, and third impurity regions 91, 93, and 95 may be electrically connected to data bit regions 11, 31, and 51 constituting the MTJ cells of the first, second, and third memory tracks 10, 30, and 50 via conductive plugs 86, 87, and 88, respectively. One end of each of the conductive plugs 86, 87, and 88 may contact the first, second, and third impurity regions 91, 93, and 95, respectively. The other ends of each of the conductive plugs 86, 87, and 88 may contact data bit regions 11, 31, and 51 that may constitute MTJ cells of the first, second, and third memory tracks 10, 30, and 50.

Because the selector 90 may be formed to have a shared transistor structure, the structure of the selector 90 may be relatively simpler than where transistors are formed for each of the memory tracks 10, 30, and 50. If the transistors are formed for each of the memory tracks 10, 30, and 50, up to three gates and six impurity regions may be required. If the shared transistor structure is used, it may be possible to perform an operation of selecting one of the memory tracks 10, 30, and/or 50 with only two gates and three impurity regions.

The first input portion 80 may be electrically connected to the first, second, and third memory tracks 10, 30, and 50 to move a magnetic domain of the memory tracks 10, 30, and 50 and thus move data stored in an in-plane magnetization or a perpendicular magnetization in a data bit region to an adjoining data bit region. Switches (not shown) may be between the first input portion 80 and the first, second, and third memory tracks 10, 30, and 50 so that a magnetic domain motion signal may be input to only a selected and/or desired memory track.

A magnetic domain motion signal (Pulse 1) may be applied to the memory tracks 10, 30, and 50 through the first input portion 80. A magnetization direction of a magnetic domain may be moved to an adjacent magnetic domain according to a magnetic domain motion signal. The magnetic domain motion signal may be a motion current signal input through the first input portion 80. This motion may be referred to as a magnetic domain motion.

Figure 5:
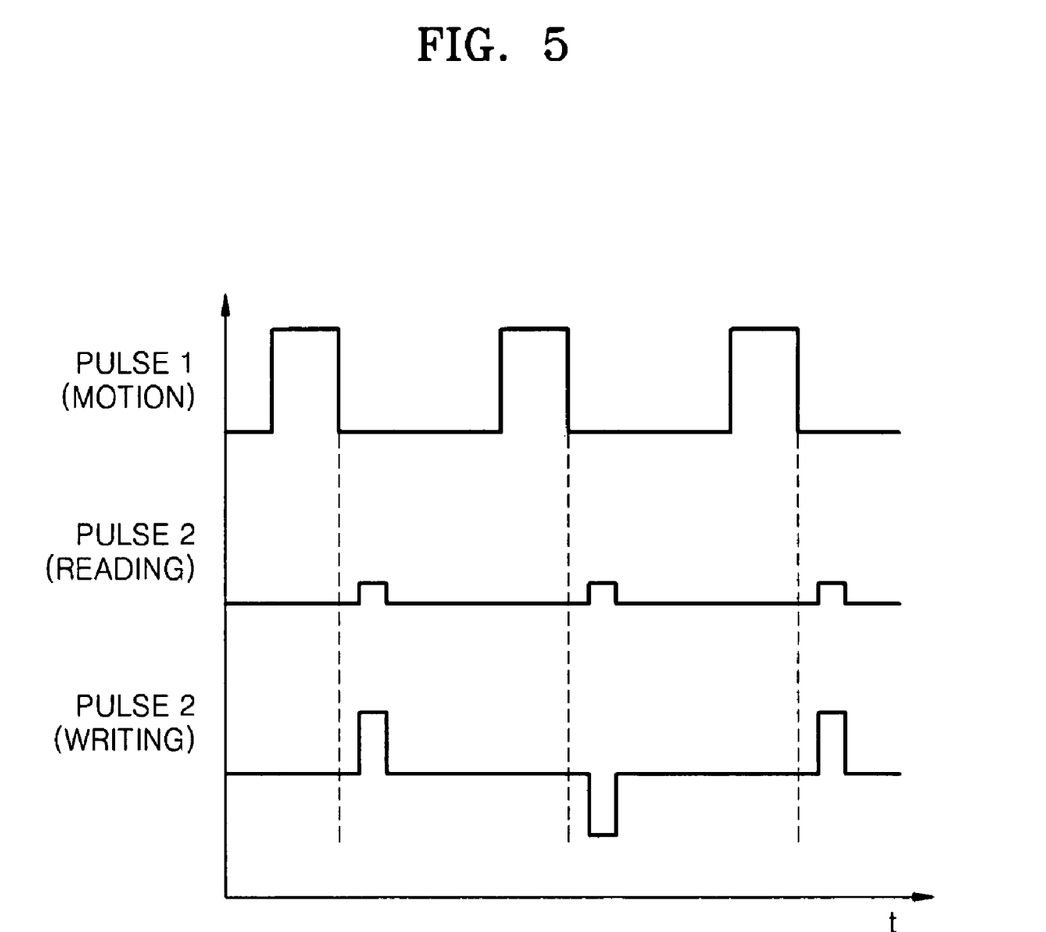
FIG. 5 is a schematic graph illustrating a magnetic domain motion current signal, a reading pulse signal current, and/or a writing switching current signal that may be applied to an example embodiment magnetic memory device.

The magnetic domain motion signal may be a current signal of a pulse having a desired period as illustrated in FIG. 5. The magnetic domain motion signal may be input such that the magnetic domain motion is performed by a data bit region unit that includes a single magnetic domain. Because the magnetic domain motion may move a magnetization direction of a magnetic domain to an adjoining magnetic domain, the motion signal may continue while the magnetic domain motion is performed by a data bit region unit and may be periodically applied such that the magnetic domain motion may be performed by a data bit region unit.

An example embodiment magnetic memory device may have one or more or both of a data writing operation and a data reading operation performed by applying a current.

The magnetic memory device may include a second input portion 85 that may input at one or more of a writing current signal and/or a reading current signal to a MTJ cell via the bit lines 20, 40, and 60. An example embodiment magnetic memory device may not require an electrode pad, whereas a related art magnetic memory device which applies a magnetic field to an MTJ cell may require an electrode pad in order to perform a writing operation. In the example embodiment magnetic memory device in FIG. 1, the connectors 15, 35, and 55, data bit regions 11, 31, and 51 of the memory tracks 10, 30, and 50 that may form MTJ cells, and the conductive plugs 86, 87, and 88 that may each connect the data bit regions 11, 31, and 51 with the impurity regions 91, 93, and 95 of the selector 90 may be arranged linearly so as to potentially further simplify the structure of the magnetic memory device.

An example embodiment magnetic memory device that may allow a data writing operation and/or a data reading operation performed by applying current will be described below.

The second input portion 85 may be electrically connected to the bit lines 20, 40, and 60. The second input portion 85 may be electrically connected to the memory tracks 10, 30, and 50 via the data bit regions 11, 31, and 51 of the memory tracks 10, 30, and 50 and the reference layers 19 that may form MTJ cells.

Switches (not shown) may be between the second input portion 85 and the first, second, and third bit lines 20, 40, and 60 so that a writing signal or a reading signal may be input to only a desired and/or selected memory track through a bit line.

Figure 2A:
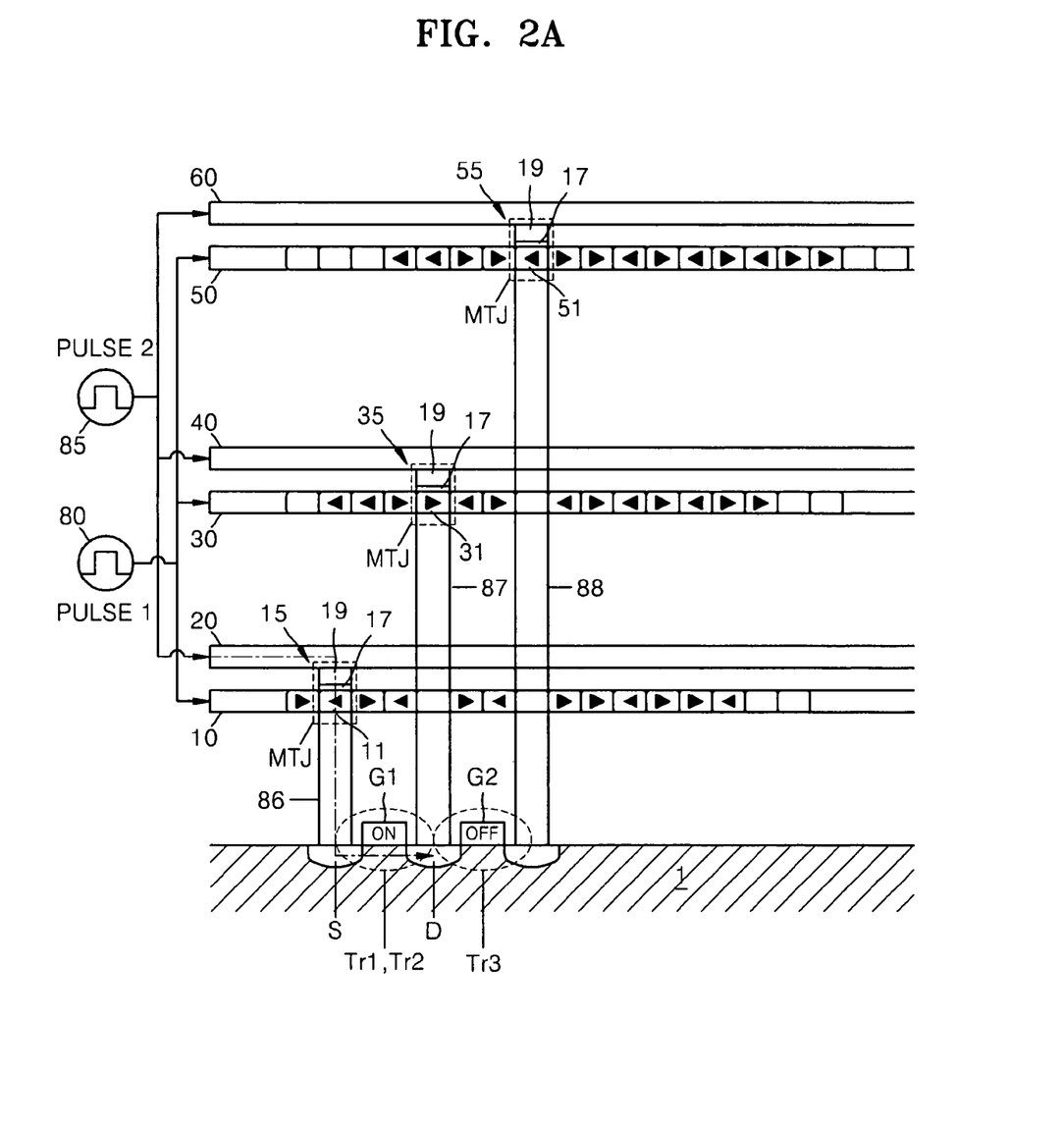
FIGS. 2A through 2C are views illustrating operational states when writing or reading operations are performed on first, second, and third memory tracks of the example embodiment magnetic memory device of FIG. 1.

FIG. 2A is a diagram illustrating operational state if a writing operation and/or a reading operation is performed on the first memory track 10 of the example embodiment magnetic memory device of FIG. 1. If a writing operation and/or a reading operation is performed on the first memory track 10, the first gate G1 may be turned on, the second gate G2 may be turned off, and a writing signal and/or a reading signal from the second input portion 85 may be input to the first bit line 20. The first impurity region 91 may serve as a source, and the second impurity region 93 may serve as a drain.

Figure 2B:
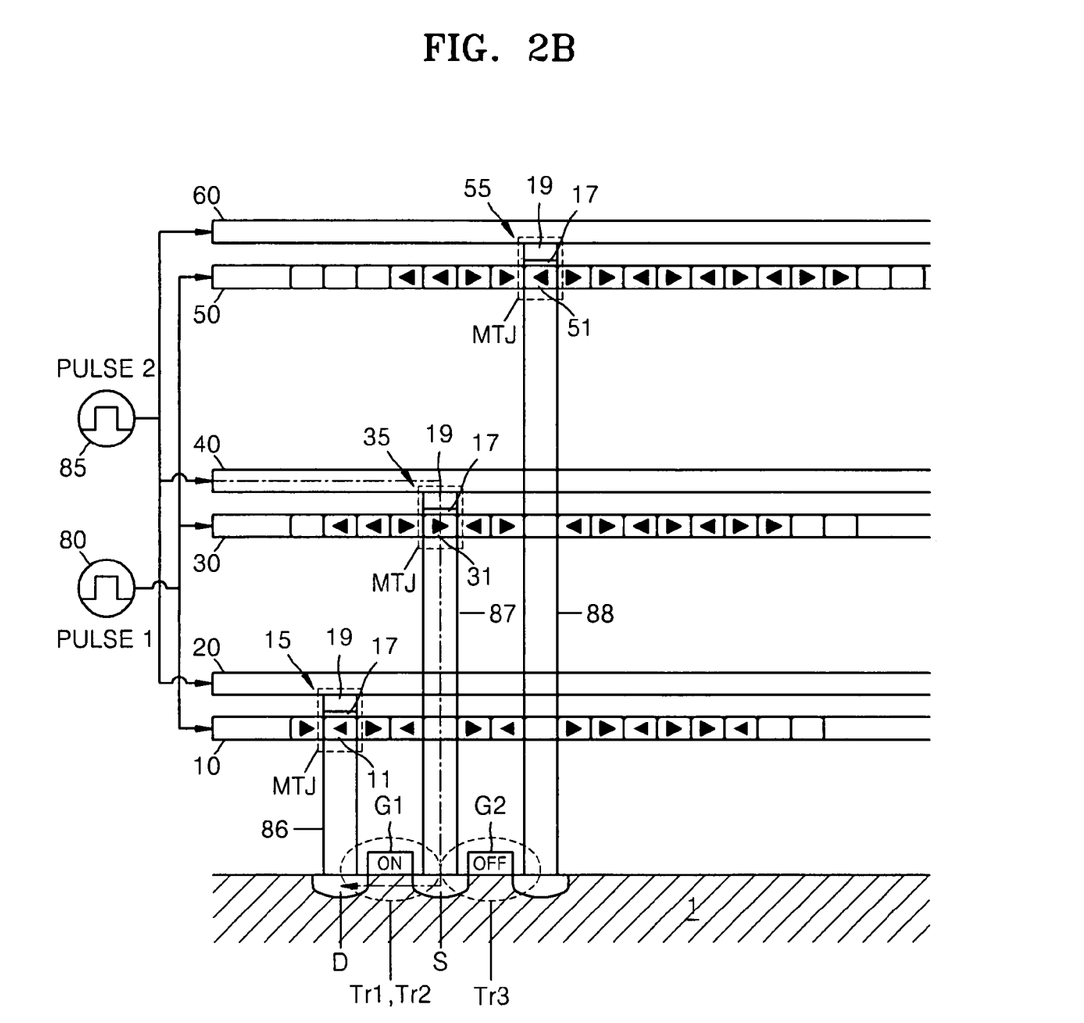

FIG. 2B is a diagram illustrating an operational state if a writing operation and/or a reading operation is performed on the second memory track 30 of the example embodiment magnetic memory device of FIG. 1. If a writing operation and/or a reading operation is performed on the second memory track 30, the first gate G1 may be turned on, the second gate G2 may turned off, and a writing signal and/or a reading signal from the second input portion 85 may be input to the second bit line 40. The first impurity region 91 may serve as a drain, and the second impurity region 93 may serve as a source.

The second impurity region 93, the second gate G2, and/or the third impurity region 95 of the selector 90 may be used as a transistor for the second and/or third memory tracks 30 and 50, where the first gate G1 may be turned off and the second gate G2 may be turned on.

Figure 2C:
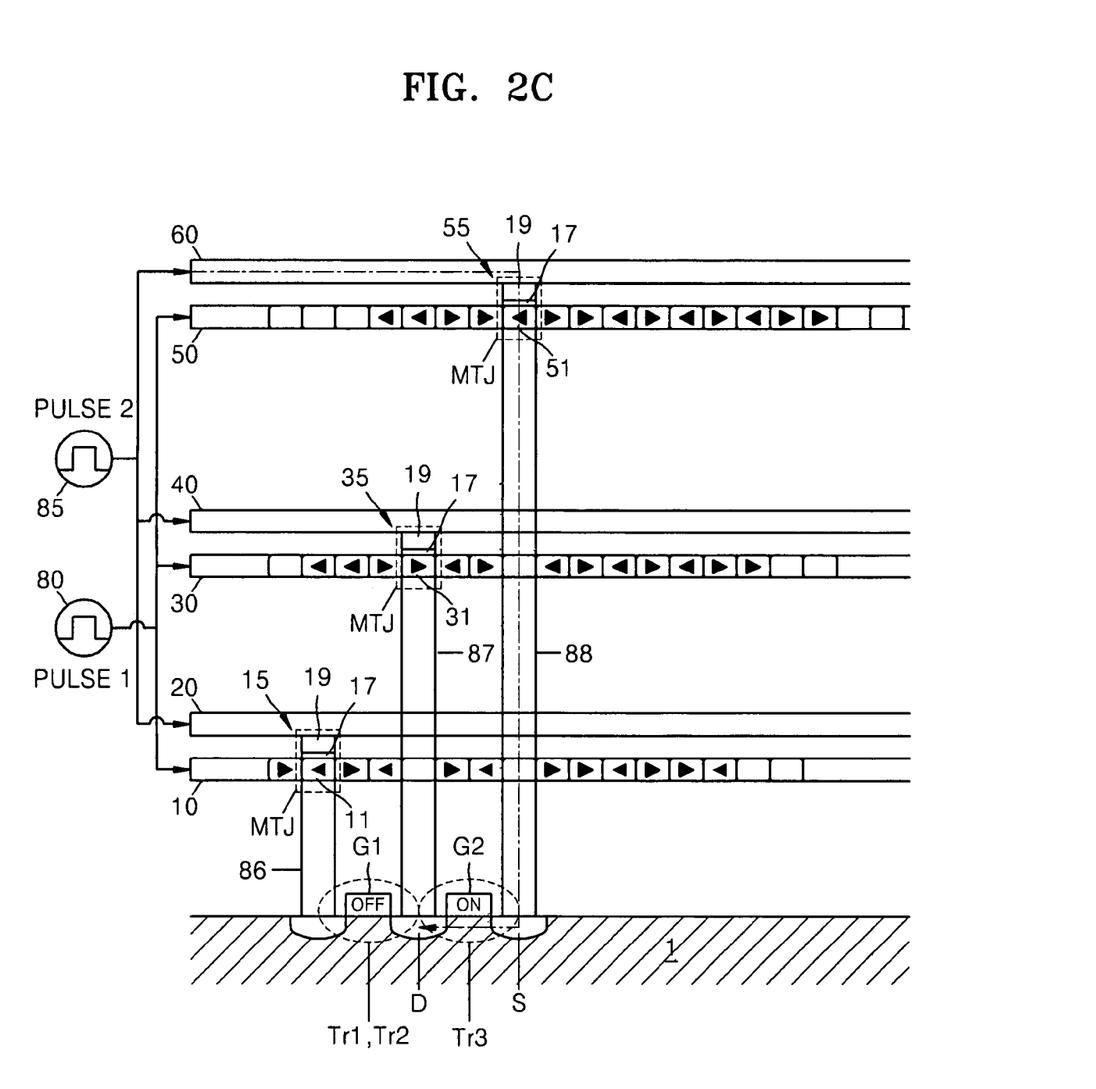

FIG. 2C is a diagram illustrating an operational state if a writing operation and/or a reading operation is performed on the third memory track 50 of the example embodiment magnetic memory device of FIG. 1. If a writing operation and/or a reading operation is performed on the third memory track 50, the first gate G1 may be turned off, the second gate G2 may be turned on, and/or one of a writing signal and/or a reading signal from the second input portion 85 may be input to the third bit line 60. The second impurity region 93 may serve as a drain, and the third impurity region 95 may serve as a source.

A writing signal and/or a reading signal may be input in synchronization with a magnetic domain motion signal.

In an example embodiment magnetic memory device, magnetic domains of a memory track may be moved, and a data bit, for example, "0" or "1," may be recorded on a data bit region that may form an MTJ cell of a memory track according to a magnetic domain motion signal, for example Pulse 1, applied from the first input portion 80 to the memory track, and/or a writing current signal, for example Pulse 2 in FIG. 5, applied in synchronization with this magnetic domain motion signal from the second input portion 85 to the data bit region forming the MTJ cell of the memory track through a bit line. Magnetization may be reversed using spin transfer torque, for example, current-induced magnetic switching (CIMS) or the like, according to a writing current signal so that a data bit, for example, "0" or "1," may be recorded.

A writing signal may be input from the second input portion 85 to a data bit region and reference layer 19 of a memory track through one bit line among the first, second, and third bit lines 20, 40, and 60. A magnetization direction of a data bit region of the memory track located below the reference layer 19 may be determined according to this writing signal.

A magnetization direction of the data bit region may be determined according to a writing signal input from the second input portion 85. For example, if the data bit region has a magnetization direction, the magnetization direction of the data bit region may be reversed or may maintain its original magnetization direction depending on an applied writing signal. The magnetization direction determined in this manner may represent a recorded data bit.

As shown in FIG. 5, the writing signal may be a pulse-type switching current. A magnetization direction of a data bit region of a memory track may be selectively switched depending on the polarity of the switching current, and a data bit may be stored on the data bit region corresponding to the polarity of the switching signal.

For example, assuming that a data bit may be set to "0" if a magnetization direction of a data bit region becomes the same as, or parallel to, that of the reference layer 19 by application of a switching current, a data bit may be set to "1" if the data bit region has a magnetization direction different or anti-parallel to that of the reference layer 19 by application of a switching current having an opposite polarity. Data may be stored by changing the polarity of the switching current to set the magnetization direction of the data bit region to the same as or different than that of the reference layer 19.

The magnetization direction of the reference layer 19 may be determined in advance. Assuming that a data bit may be set to "0" if the magnetization direction of the data bit region of the memory track is parallel to that of the magnetization direction of the reference layer 19, and a data bit may be set to "1" if the magnetization direction of the data bit region is anti-parallel to that of the magnetization direction of the reference layer 19, data may be stored by switching the magnetization direction of the data bit region of the memory track.

In an example embodiment magnetic memory device, a magnetic domain may be moved, and data on a magnetic domain of a memory track may be read using, for example, spin tunnelling or another suitable process, according to a magnetic domain motion signal applied from the first input portion 80 to the memory track, and a reading current signal, for example, a pulse type current signal for reading such as Pulse 2 (reading) in FIG. 5, applied, in synchronization with the magnetic domain motion signal such as Pulse 1, from the second input portion 85 to an MTJ cell of the memory track through a bit line.

Data may be read by measuring variation in intensity of a current and/or resistance of a data bit region depending on a magnetization direction of the data bit region of a memory track with respect to the magnetization direction of the reference layer 19.

As shown in FIG. 5, the reading pulse current may have smaller amplitude than the switching current for writing. The reading pulse current may be applied in synchronization with the domain motion signal. Stored data may be read using a magnetic domain motion based on a magnetization direction of a data bit region located on the reference layer 19.

In the example embodiment magnetic memory device having the above-described structure, the writing switching current, reading pulse current, and/or pulses of the input motion signal may be alternately input. A data writing operation, stored data reading operation, and/or a magnetic domain motion may be alternately performed, so that a plurality of data bits may be recorded on or read from a plurality of data bit regions.

A data writing operation and/or a stored data reading operation of a memory track of an example embodiment magnetic memory device will be described below with reference to FIGS. 3A through 3C, and 4A and 4B. An example embodiment where the data storage region 71 of the memory track includes six data bit regions will be described.

Figure 3A:
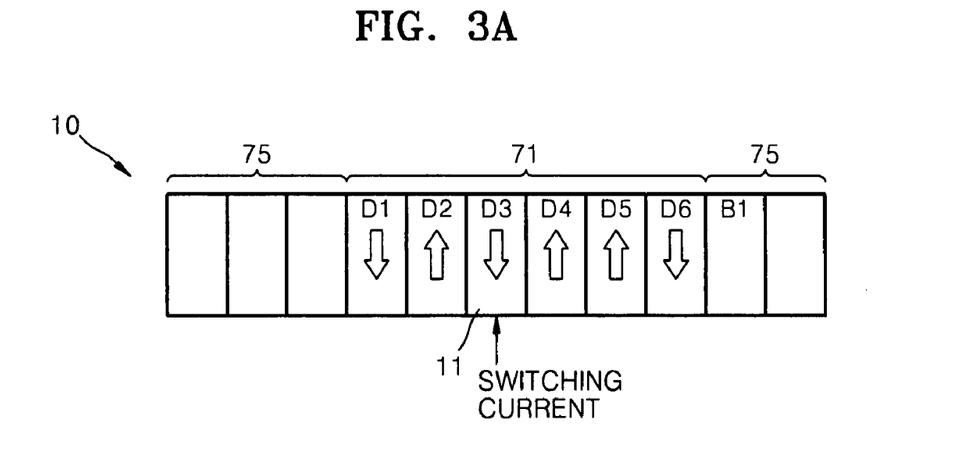
FIGS. 3A through 3C are views illustrating a data writing operation performed on a memory track of an example embodiment magnetic memory device.
Figure 3B:
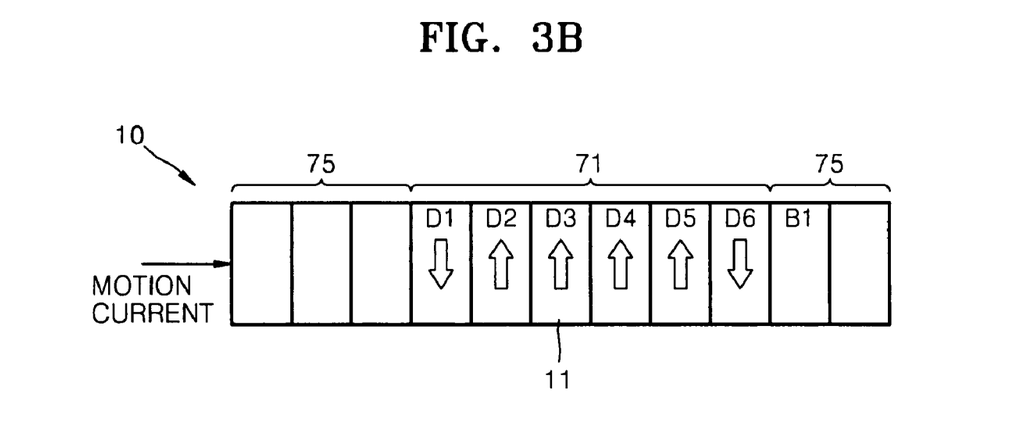
Figure 3C:
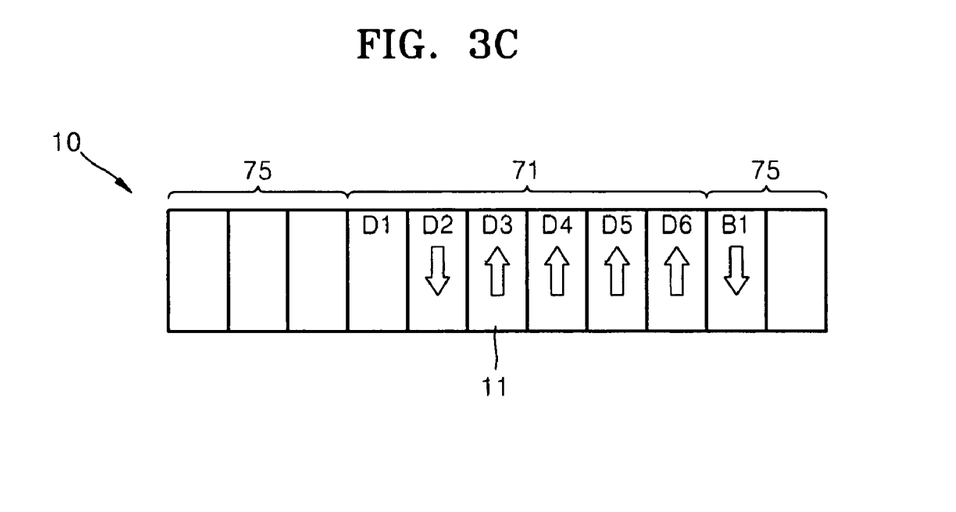
Figure 4A:
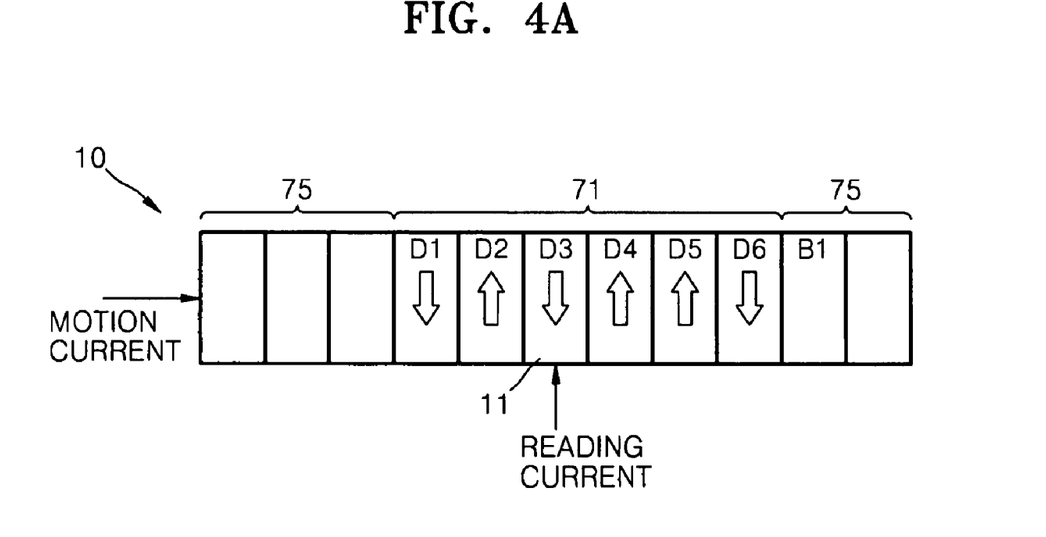
FIGS. 4A and 4B are views illustrating a stored data reading operation performed on a memory track of an example embodiment magnetic memory device.
Figure 4B:
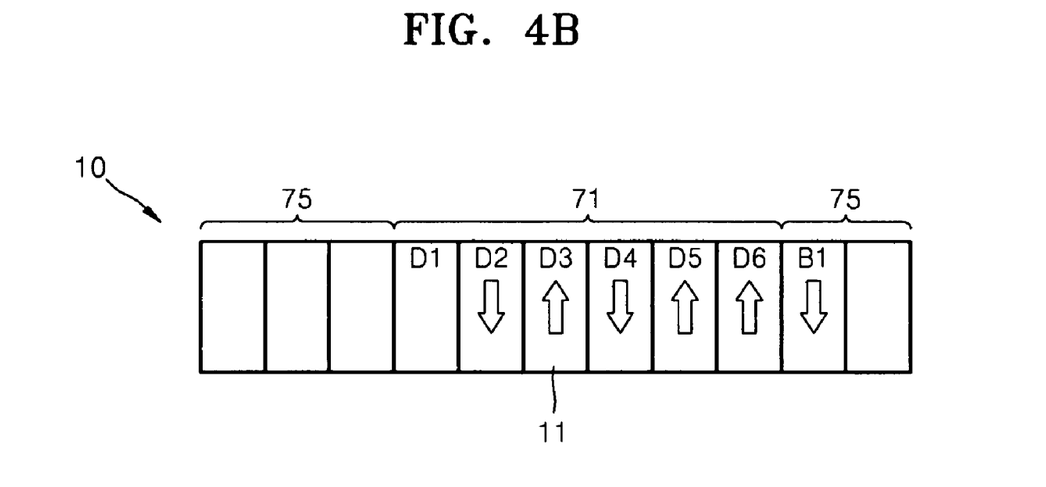

FIGS. 3A through 3C are views illustrating a data writing operation performed on a memory track of an example embodiment magnetic memory device; FIGS. 4A and 4B are views illustrating a stored data reading operation performed on a memory track of an example embodiment magnetic memory device; and FIG. 5 is a schematic graph illustrating a magnetic domain motion signal, a reading pulse signal, and a writing switching current signal that may be applied to an example embodiment magnetic memory device. In FIG. 5, the horizontal axis may be a time axis t.

A data writing operation may be performed in the following manner. If a switching current is applied to a third data bit region D3 of the first memory track 10 as illustrated in FIG. 3A, a magnetization direction of the third data bit region D3 may be reversed as illustrated in FIG. 3B. If the magnetic domain motion current is applied to the first memory track 10, magnetization directions of respective data bit regions may be moved to adjacent data bit regions, as illustrated in FIG. 3C. Magnetization directions of data bit regions D1, D2, D3, D4, D5, and D6 of the data storage region 71 illustrated in FIG. 3B may be each moved one data bit region to the data bit regions D2, D3, D4, D5, D6, and a first data bit region B1 of an adjoining buffer region 75 as illustrated in FIG. 3C.

The magnetization direction of the data bit region 11 may be defined, and data of the data bit region 11 may be moved to an adjoining data bit region, for example, a fourth data bit region D4, after a desired time elapses, and a writing signal may be re-input to the data bit region 11 to again define a magnetization direction. Using the magnetic domain motion current applied and the writing switching current applied in synchronization with the magnetic domain motion current illustrated in FIG. 5, a magnetization direction and the motion process may be alternately performed and a plurality of data bits may be recorded in an array on the plurality of data bit regions of the first memory track 10. After the data recording operation is completed, a data storage position may be maintained and/or a motion signal moving the magnetic domains in the opposite direction may be input, so that data stored can be maintained on the data bit regions D1, D2, D3, D4, D5, and D6 of the data storage region 71.

The stored data reading operation may be performed in the following manner. Referring to FIG. 4A, a reading pulse current is applied to the third data bit region D3 so that data of the third data bit region D3 is read. If the magnetic domain motion current is applied to the first memory track 10 as illustrated in FIG. 4B, magnetization directions of respective data bit regions may be moved to adjacent data bit regions. Magnetization directions of the data bit regions D1, D2, D3, D4, D5, and D6 of the data storage region 71 illustrated in FIG. 4A. may be respectively moved by one data bit region to the next data bit regions D2, D3, D4, D5, D6, and the first data bit region B1 of the adjoining buffer region 75, as illustrated in FIG. 4B.

The magnetization direction of the data bit region 11 may be read, and data represented by a magnetization direction of the data bit region 11 may be moved to an adjoining data bit region, for example, a fourth data bit region D4, after a desired time elapses, and a reading signal may be re-input to the data bit region 11 to perform a data reading operation. Using the magnetic domain motion current and the reading pulse current applied in synchronization with the magnetic domain motion current illustrated in FIG. 5, reading of a magnetization direction and the motion process may be alternately performed until reading of a plurality of data bits stored on the first memory track 10 is completed. After the data reading operation is completed, a data storage position may be maintained and/or a motion signal moving the magnetic domains in the opposite direction may be input, so that data originally stored on the data bit regions D1, D2, D3, D4, D5, and D6 of the data storage region 71 may be returned to the data bit regions D1, D2, D3, D4, D5, and D6, and maintained there.

A data writing and/or reading operation for the second and third memory tracks 30 and 50 may be performed as illustrated in FIGS. 3A through 3C, and FIGS. 4A and 4B.

During a reading operation, a reading pulse current may be applied in synchronization with a domain motion signal without polarity reversion as illustrated in FIG. 5. An amount of current flowing through a tunnel barrier and a resistance encountered by the reading pulse current applied to the reference layer 19 and data bit regions 11, 31, and 51 may differ depending on whether magnetization directions of the data bit regions are parallel to or anti-parallel to a magnetization direction of the reference layer 19. For example, if the magnetization directions of the data bit regions 11, 31, and 51 of the memory tracks 10, 30, and 50 are parallel to the reference layer 19, resistance of a corresponding tunnel barrier may be smaller than if the magnetization directions of the data bit regions 11, 31, and 51 are anti-parallel to the reference layer 19. Data stored in the data bit regions 11, 31, and 51 may be read using such a resistance difference.

Though a magnetic domain motion may be performed in units of one data bit region and the magnetic domain motion and the data bit writing or reading operation may be alternatively performed, other configurations and various modifications may be possible. For example, after a plurality of data bit regions is moved, the writing and/or reading operation may be performed.

The example embodiment magnetic memory device may incorporate a magnetic device, for example, an MTJ or GMR sensor, capable of reading a plurality of data bits and/or a recording magnetic device using spin transfer torque in a single device, but alternate configurations are equally possible. An example embodiment magnetic memory device may be used as a magnetic device capable of reading a plurality of data bits using a magnetic domain motion or may be also used as a recording magnetic device using spin transfer torque capable of recording a plurality of data bits using the magnetic domain motion.

In an example embodiment magnetic memory device, a data bit may be recorded by selectively reversing a magnetization direction of a magnetic domain of a data bit region included in one or more memory tracks 10, 30 and 50 using a magnetic field induced by a current. An example embodiment magnetic memory device may include a structure generating a magnetic field for selectively reversing a magnetization direction of a data bit region of a memory track and a FET for reading data stored in the memory track, instead of the second input portion 86 directly applying a writing or reading current signal to the memory track.

An example embodiment magnetic memory may have a multi-stacked structure of the first, second, and third memory tracks 10, 30, and 50, but the number of memory tracks formed in a multi-stack may change.

In an example embodiment magnetic memory device, a plurality of magnetic domains may be provided so that data bits can be stored in an array. Because example embodiments may provide a memory track using a magnetic domain motion and memory track formed in a multi-stack, data storage capacity may increase.

Because the selector selecting a memory track on which a reading or writing operation is to be performed is realized using the shared transistor, the structure of the selector can be simplified even more.

While the example embodiments have been particularly shown and described with reference to example embodiments thereof, it will be understood by those of ordinary skill in the art that various changes in form and details may be made therein without departing from the spirit and scope of example embodiments as defined by the following claims.

What is claimed is:

1. A magnetic memory device comprising:
   at least one memory track on a substrate, wherein the at least one memory track includes at least one data bit region with a magnetic domain;
   at least one bit line corresponding to the at least one memory track;
   a connector electrically connecting the at least one data bit region of the at least one memory track and the at least one corresponding bit line so as to permit electric current to flow between the at least one data bit region and the at least one corresponding bit line;
   a first input portion electrically connected to the at least one memory track configured to input a magnetic domain motion signal to move data stored in the at least one data bit region of the at least one memory track to an adjacent data bit region; and
   a selector that selects the memory track for at least one of a reading and writing operation.

2. The memory device of claim 1, wherein the memory tracks are stacked on a substrate to form a multi-stack.

3. The memory device of claim 1, further comprising:
   a buffer region that adjoins the at least one data bit region and stores data moved outside of the at least one data storage bit during a magnetic domain motion.

4. The memory device of claim 1, further comprising:
   a second input portion configured to input at least one of a writing signal and a reading signal to the connector via the bit line.

5. The memory device of claim 1, wherein the selector includes a plurality of impurity regions connected to the at least one data bit region and a gate between each impurity region of the plurality of impurity regions, and wherein the selector has a shared transistor structure, wherein at least one impurity region of the plurality of impurity regions serves as a drain for a memory track and serves as a source for another memory track, and wherein each of the plurality of impurity regions is connected to the at least one data bit region via a conductive plug.

6. The memory device of claim 1, wherein the connector includes a magnetic tunnel junction cell and the at least one data bit region of the at least one memory track is connected to the connector.

7. The memory device of claim 6, further comprising:
   a second input portion configured to input at least one of a writing signal and a reading signal to the magnetic tunnel junction cell via the bit line.

8. The memory device of claim 1, wherein the connector includes a reference layer having a pinned magnetization direction, and wherein the at least one data bit region is an effective size of the reference layer and stores an array of data bits on the at least one memory track.

9. The memory device of claim 8, wherein the connector further includes a non-magnetic layer between the reference layer and the at least one memory track.

10. The memory device of claim 9, wherein the non-magnetic layer is one of a conduction layer or an insulation layer acting as a tunnel barrier.

11. The memory device of claim 1, wherein the at least one memory track includes a plurality of data bit regions, the plurality of data bit regions having a number of data bit regions corresponding to the number of data bits to be stored, and wherein the plurality of data bit regions stores a plurality of data bits.

12. The memory device of claim 11, further comprising:
a second input portion configured to input at least one of a writing signal and a reading signal to the magnetic tunnel junction cell via the bit line.

13. The memory device of claim 11, further comprising:
a plurality of buffer regions, wherein each buffer region of the plurality of buffer regions is between each data bit region of the plurality of data bit regions and stores data moved outside each data bit region during a magnetic domain motion.

14. The memory device of claim 13, further comprising:
a plurality of connectors and a plurality of selectors, wherein each connector of the plurality of connectors and each selector of the plurality of selectors corresponds to a data bit region of the plurality of data storage regions.

15. The memory device of claim 14, wherein each selector of the plurality of selectors includes a plurality of impurity regions connected to a data bit region of the plurality of data bit regions and a gate between each impurity region of the plurality of impurity regions, and wherein each selector has a shared transistor structure wherein at least one impurity region of the plurality of impurity regions serves as a drain for a memory track and serves as a source for another memory track, and wherein each of the plurality of impurity regions is connected to each data bit region of the plurality of data bit regions via a conductive plug.

16. The memory device of claim 14, wherein each connector of the plurality of connectors includes a reference layer having a pinned magnetization direction, and wherein each data bit region of the plurality of data bit regions is an effective size of the reference layer and stores an array of data bits on the memory track.

17. The memory device of claim 16, wherein the each connector of the plurality of connectors further includes a non-magnetic layer between the reference layer and the memory track.

18. The memory device of claim 16, wherein the non-magnetic layer is one of a conduction layer and an insulation layer acting as a tunnel barrier.

* * * * *